(12) United States Patent
Kim et al.

(10) Patent No.: US 8,772,897 B2
(45) Date of Patent: Jul. 8, 2014

(54) THIN-FILM TRANSISTOR, ARRAY SUBSTRATE HAVING THE SAME AND METHOD OF MANUFACTURING THE SAME

(75) Inventors: Ki-Won Kim, Suwon-si (KR); Kap-Soo Yoon, Seoul (KR); Woo-Geun Lee, Yongin-si (KR); Yeong-Keun Kwon, Suwon-si (KR); Hye-Young Ryu, Seoul (KR); Jin-Won Lee, Cheonan-si (KR); Hyun-Jung Lee, Dongducheon-si (KR)

(73) Assignee: Samsung Display Co., Ltd. (KR)

( * ) Notice: Subject to any disclaimer, the term of this patent is extended or adjusted under 35 U.S.C. 154(b) by 125 days.

(21) Appl. No.: 13/049,783

(22) Filed: Mar. 16, 2011

(65) Prior Publication Data

US 2011/0284852 A1    Nov. 24, 2011

(30) Foreign Application Priority Data

May 20, 2010    (KR) .................. 10-2010-0047341

(51) Int. Cl.
*H01L 27/146*    (2006.01)
(52) U.S. Cl.
USPC ........ 257/443; 257/292; 257/655; 257/E27.1; 257/E27.112; 257/E29.117; 257/E29.151; 257/E21.413; 438/149

(58) Field of Classification Search
USPC .............. 257/292, 443, 655, E27.1, E27.112, 257/E29.117, E29.151, E21.413; 438/149
See application file for complete search history.

(56) References Cited

U.S. PATENT DOCUMENTS

| 6,534,788 | B1 * | 3/2003 | Yeo et al. .................. 257/72 |
| 2005/0082492 | A1 * | 4/2005 | Lin et al. .................. 250/370.14 |
| 2005/0247937 | A1 * | 11/2005 | Yamazaki et al. .......... 257/59 |
| 2007/0111408 | A1 * | 5/2007 | Arao .......................... 438/151 |
| 2008/0078991 | A1 * | 4/2008 | Kim ............................ 257/40 |

* cited by examiner

*Primary Examiner* — Su Kim
(74) *Attorney, Agent, or Firm* — Innovation Counsel LLP

(57) ABSTRACT

A thin-film transistor includes a semiconductor pattern, a first gate electrode, a source electrode, a drain electrode and a second gate electrode. The semiconductor pattern is formed on a substrate. A first conductive layer has a pattern that includes the first gate electrode which is electrically insulated from the semiconductor pattern. A second conductive layer has a pattern that includes a source electrode electrically connected to the semiconductor pattern, a drain electrode spaced apart from the source electrode, and a second gate electrode electrically connected to the first gate electrode. The second gate electrode is electrically insulated from the semiconductor pattern, the source electrode and the drain electrode.

20 Claims, 12 Drawing Sheets

THIN-FILM TRANSISTOR, ARRAY SUBSTRATE HAVING THE SAME AND METHOD OF MANUFACTURING THE SAME

PRIORITY STATEMENT

This application claims priority under 35 U.S.C. §119 to Korean Patent Application No. 2010-47341, filed on May 20, 2010 in the Korean Intellectual Property Office (KIPO), the contents of which are herein incorporated by reference in their entirety.

BACKGROUND OF THE INVENTION

1. Field of the Invention

Example embodiments of the present invention relate generally to thin-film transistor ("TFT") arrays. More particularly, example embodiments of the present invention relate to a TFT with decreased variation in threshold voltage and improved electrical reliability, an array substrate having the TFT, and a method of manufacturing the TFT.

2. Description of the Related Art

Generally, flat panel display devices include an array substrate with a number of switching elements and a counter substrate opposite to the array substrate. Each switching element includes a gate electrode connected to a gate line, a semiconductor pattern electrically insulated from the gate electrode, a source electrode connected to a data line to be electrically connected to the semiconductor pattern, and a drain electrode spaced apart from the source electrode to be electrically connected to the semiconductor pattern.

The switching elements may be, for example, amorphous-silicon (a-Si) TFTs, poly-silicon (poly-Si) TFTs, oxide semiconductor TFTs, etc.

The a-Si TFT has is the benefit of being readily formed in uniform manner on large size substrates and are thus relatively low cost. However, the a-Si TFT has relatively low charge mobility. In contrast, poly-Si TFTs have the benefit of high charge mobility, so that deterioration of the switching element's characteristics is small in comparison with the a-Si TFT. However, the poly-Si TFT liquid crystal display (LCD) has a more complex manufacturing process than the a-Si TFT, so that its manufacturing cost is higher than that of the a-Si TFT.

The oxide semiconductor TFT may be manufactured in a low temperature process, and may be utilized in large size display panels. In addition, the oxide semiconductor TFT may have high charge mobility. However, the oxide semiconductor TFT requires a bias voltage to be applied to one electrode, resulting in threshold voltage that can vary with time. This reduces the electrical stability and reliability of the switching element.

SUMMARY OF THE INVENTION

Example embodiments of the present invention provide a thin-film transistor ("TFT") with reduced variation in threshold voltage and increased electrical reliability.

Example embodiments of the present invention also provide an array substrate having the above-mentioned TFT.

Example embodiments of the present invention further also provide a method of manufacturing the above-mentioned TFT.

According to one aspect of the present invention, a TFT includes a semiconductor pattern, a first gate electrode, a source electrode, a drain electrode and a second gate electrode. The semiconductor pattern is formed on a substrate. A first conductive layer has a pattern that includes a first gate electrode electrically insulated from the semiconductor pattern. A second conductive layer having a pattern that includes a source electrode electrically connected to the semiconductor pattern, a drain electrode spaced apart from the source electrode, and a second gate electrode electrically connected to the first gate electrode. The second gate electrode is electrically insulated from the semiconductor pattern, the source electrode and the drain electrode.

In an example embodiment, the second gate electrode may be disposed between the source electrode and the drain electrode and spaced apart from both the source electrode and the drain electrode.

In an example embodiment, the TFT may further include a connection electrode connecting the first gate electrode and the second gate electrode. The connection electrode may include an optically transparent and electrically conductive material.

In an example embodiment, the second gate electrode may contact the first gate electrode. The TFT may further include a first gate insulation layer disposed between the first gate electrode and the semiconductor pattern. The first gate insulation layer may have a contact hole formed therethough. In this case, the second gate electrode may extend through the contact hole of the first gate insulation layer, so as to contact the first gate electrode.

In an example embodiment, the TFT may further include a second gate insulation layer disposed between the semiconductor pattern and the second gate electrode to insulate the second gate electrode from the semiconductor pattern. In this case, the semiconductor pattern may include an oxide semiconductor. The second gate insulation layer may be an etch stopper covering at least a portion of the semiconductor pattern. Each of the source electrode and the drain electrode may cover at least a portion of the semiconductor pattern and at least a portion of the etch stopper.

According to another aspect of the present invention, an array substrate includes a first conductive pattern, a first gate insulation layer, a semiconductor pattern, a second gate insulation layer, a second conductive pattern and a third conductive pattern. The first conductive pattern includes a first gate electrode formed on a substrate. The first gate insulation layer is disposed on the first gate electrode. The semiconductor pattern is formed on the first gate insulation layer and electrically insulated from the first gate electrode. The second gate insulation layer is disposed on the semiconductor pattern. The second conductive pattern includes a source electrode electrically connected to the semiconductor pattern, a drain electrode spaced apart from the source electrode, and a second gate electrode electrically connected to the first gate electrode and electrically insulated from each of the semiconductor pattern, the source electrode and the drain electrode. The third conductive pattern includes a pixel electrode electrically connected to the drain electrode.

In an example embodiment, the third conductive pattern may further include a connection electrode which is insulated from the pixel electrode and is electrically connected to the first gate electrode and the second gate electrode.

In an example embodiment, the first gate insulation layer may have a contact hole formed therethrough, and the second gate electrode may be disposed within the contact hole of the first gate insulation layer, so as to contact the first gate electrode.

In an example embodiment, the semiconductor pattern may include an oxide semiconductor. The second gate insulation layer may be an etch stopper covering at least a portion of the semiconductor pattern. In this case, each of the source electrode and the drain electrode may cover at least a portion of the semiconductor pattern and at least a portion of the etch stopper.

In an example embodiment, the array substrate may further include a first upper insulation layer which covers the source electrode, the drain electrode and the second gate electrode, and a second upper insulation layer which covers the first upper insulation layer. In this case, the pixel electrode may be disposed on the second upper insulation layer. The second upper insulation layer may be at least one of an organic insulation layer and a color filter layer.

According to still another aspect of the present invention, there is provided a method of manufacturing a TFT. In the method, a first conductive pattern including a first gate electrode is formed by patterning a first conductive layer, where the first conductive layer is on a substrate. A first gate insulation layer is formed to cover the first gate electrode. A semiconductor pattern is formed on the first gate insulation layer. A second gate insulation layer is formed on the semiconductor pattern. A second conductive pattern is formed, which includes a source electrode, a drain electrode and a second gate electrode. This second conductive pattern is formed by patterning a second conductive layer that is on the second gate insulation layer.

In an example embodiment, a contact hole may be formed, which exposes a portion of the first gate electrode and a portion of the second gate electrode. A third conductive layer may be patterned so as to form a connection electrode on the exposed first gate electrode and the exposed portion of the second gate electrode. The connection electrode may contact the first gate electrode and the second gate electrode through the contact hole.

In an example embodiment, the first gate insulation layer may be patterned to form a contact hole exposing a portion of the first gate electrode. The second gate electrode may contact the first gate electrode through the contact hole of the first gate insulation layer.

In an example embodiment, in order to form the first conductive pattern, a sacrifice layer may be formed on the first conductive layer, and a photoresist layer may be formed on the sacrifice layer. The photoresist layer may be patterned to form a first photo pattern on the first area and a second photo pattern on the second area, where the second photo pattern has a thickness greater than that of the first photo pattern. The first conductive layer and a portion of the sacrifice layer may be etched to form the first gate electrode and a sacrifice pattern on the first area. The first photo pattern may be removed to expose a portion of the sacrifice pattern that is in the first area but not the second area, and removing a portion of the second photo pattern that is in the second area to form a remaining photo pattern on the second area. The sacrifice pattern that is in the first area but not the second area, so as to form a remaining sacrifice pattern on the second area.

In an example embodiment, a first gate insulation layer may be formed on the first gate electrode and the remaining photo pattern. The remaining sacrifice pattern, the remaining photo pattern and a portion of the first gate insulation layer formed on the remaining photo pattern may be removed, so as to form the contact hole on the second area. An undercut may be formed at a side surface of the remaining sacrifice pattern. The remaining sacrifice pattern may be removed by an etching solution applied to the undercut, so as to remove the remaining sacrifice pattern and a portion of the first gate insulation layer formed on the remaining sacrifice pattern.

Embodiments of the invention concern themselves with fabricating and/or using a TFT that has a double gate structure in which gate electrodes are formed both above and below a semiconductor pattern, so that a variation of a threshold voltage in accordance with a time is decreased.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Hereinafter, the present invention will be explained in detail with reference to the accompanying drawings.

Figure 1:
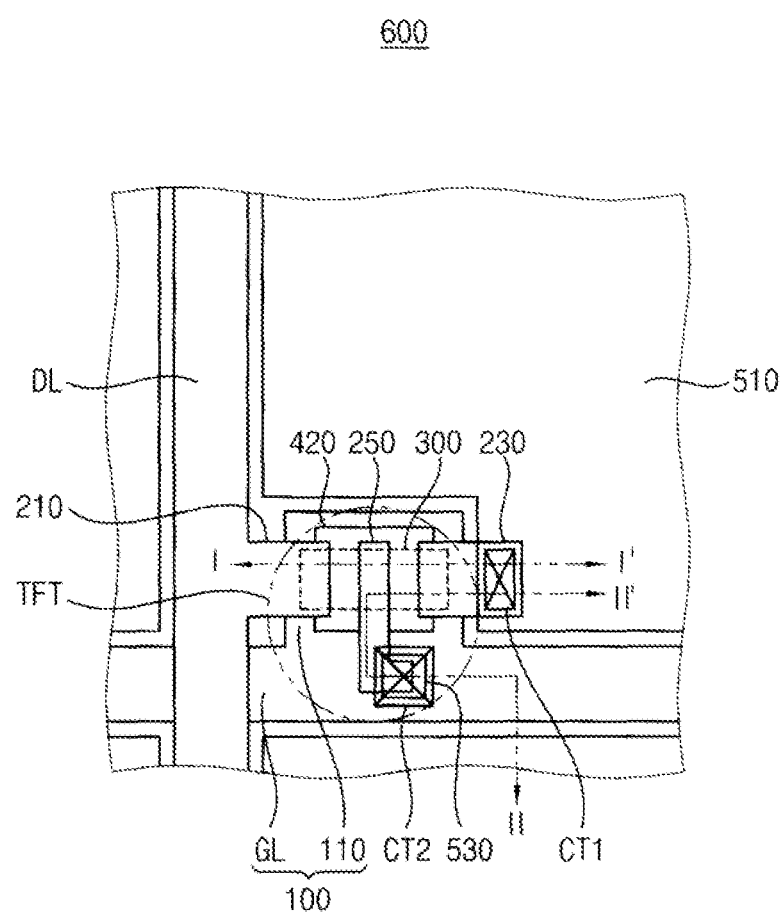
FIG. 1 is a plan view illustrating an array substrate according to an exemplary embodiment of the present invention.
Figure 2:
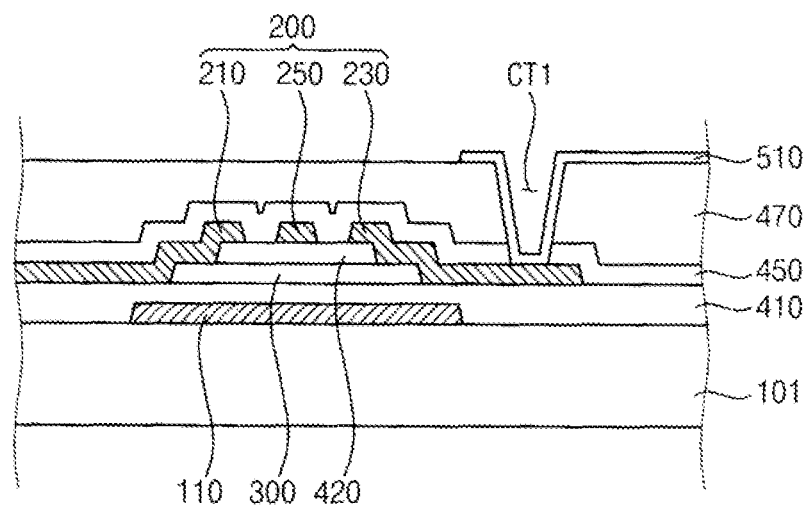
FIG. 2 is a cross-sectional view taken along a line I-I' of FIG. 1.
Figure 3:
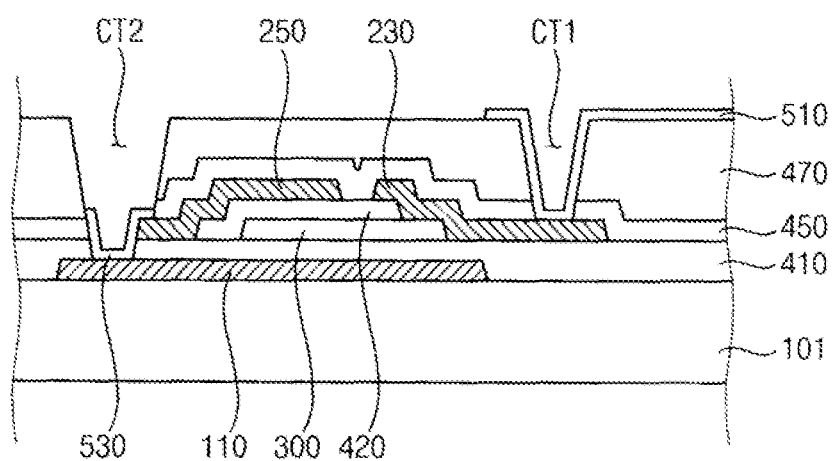
FIG. 3 is a cross-sectional view taken along a line II-II' of FIG. 1.

FIG. 1 is a plan view illustrating an array substrate according to an exemplary embodiment of the present invention. FIG. 2 is a cross-sectional view taken along a line I-I' of FIG. 1. FIG. 3 is a cross-sectional view taken along a line II-II' of FIG. 1.

Referring to FIGS. 1, 2 and 3, the array substrate includes a gate line GL, a data line DL, a thin-film transistor ("TFT") and a pixel electrode 510.

The TFT includes a first gate electrode 110, a first gate insulation layer 410, a semiconductor pattern 300, a second gate insulation layer 420, a source electrode 210, a drain electrode 230 and a second gate electrode 250.

The first gate electrode 110 is electrically connected to the gate line GL. More specifically, the first gate electrode 110 may be an extension protruding from the gate line GL. In this case, the first gate electrode 110 is formed to be integrated with the gate line GL, so that no clear boundary exists between the first gate electrode 110 and the gate line GL. The gate line GL and the first gate electrode 110 are included in a first conductive pattern 100 formed from a first conductive layer (i.e., a gate conductive layer). That is, the first conductive pattern 100 corresponds to a gate conductive pattern which includes the gate line GL and the first gate electrode 110. The first conductive pattern 100 may include a metal such as aluminum (Al), copper (Cu), molybdenum (Mo), titanium (Ti), etc., or a metal alloy thereof. Moreover, the first conductive pattern 100 may include an optically transparent and electrically conductive material such as indium tin oxide (ITO), indium zinc oxide (IZO), aluminum doped zinc oxide (AZO), or the like. However, the material of the first conductive pattern 100 is not limited to any of these, and may be any suitable material or structure. As one example, the first conductive pattern 100 may have a single layer structure. As another example, the first conductive pattern 100 may have a multiple layer structure in which plural conductive layers are deposited thereon, or plural conductive layers and plural insulation layers are deposited thereon.

A first gate insulation layer 410 covers the first gate electrode 110. The first gate insulation layer 410 insulates the gate line GL from the data line DL. Moreover, the first gate insulation layer 410 insulates the first gate electrode 110 from the semiconductor pattern 300.

The semiconductor pattern 300 is disposed on the first gate insulation layer 410 and generally corresponds to an upper portion of the first gate electrode 110. The semiconductor pattern 300 is used as a channel layer of a TFT. The semiconductor pattern 300 may include an oxide semiconductor material. This oxide semiconductor material may include a zinc oxide, tin oxide, Ga—In—Zn oxide, In—Zn oxide, In—Sn oxide, In—Ga—Zn oxide, In—Zn—Sn oxide, In—Ga—Zn—Sn oxide, or the like. These materials may be used alone or in combination thereof. Moreover, a metal such as aluminum (Al), nikel (Ni), copper (Cu), tantalum (Ti), molybdenum (Mo), hafnium (Hf), titanium (Ti), niobium (Nb), chromium (Cr), tungsten (W), etc., may be doped into these oxide semiconductor materials. However, the oxide semiconductor material is not limited to any of the above.

A source electrode 210 is electrically connected to the data line DL. For example, the source electrode 210 may be an extension protruding from the data line DL. The source electrode 210 is electrically connected to the semiconductor pattern 300.

A drain electrode 230 is spaced apart from the source electrode 210 and is electrically connected to the semiconductor pattern 300. The source electrode 210 and the drain electrode 230 may be disposed on two end portions of the semiconductor pattern 300. For example, in the present embodiment, the source electrode 210 overlaps with a first end portion of the semiconductor pattern 300 and the drain electrode 230 overlaps with a second end portion of the semiconductor pattern 300.

The data line DL, the source electrode 210 and the drain electrode 230 may be included in a second conductive pattern 200 formed from a second conductive layer (i.e., a data conductive layer). That is, the second conductive pattern 200 corresponds to a data conductive pattern including the data line DL, the source electrode 210 and the drain electrode 230. The second conductive pattern 200 may include a metal such as aluminum (Al), copper (Cu), molybdenum (Mo), titanium (Ti), etc., or a metal alloy thereof. The second conductive pattern 200 may include an optically transparent and electrically conductive material such as indium tin oxide (ITO), indium zinc oxide (IZO), aluminum doped zinc oxide (AZO), etc. However, the material of the second conductive pattern 200 is not limited to any of the above. For one example, the second conductive pattern 200 may have a single layer structure. For another example, the second conductive pattern 200 may have a multiple layer structure in which plural conductive layers are deposited thereon, or plural conductive layers and plural insulation layers are deposited thereon.

The second gate electrode 250 is electrically insulated from the semiconductor pattern 300, the source electrode 210 and the drain electrode 230. The second gate electrode 250 is electrically connected to the first gate electrode 110. Thus, a signal delivered through the second gate electrode 250 may be synchronized with a signal delivered through the first gate electrode 110. The first gate electrode 110 is disposed below the semiconductor pattern 300, and the second gate electrode 250 is disposed above the semiconductor pattern 300. That is, the TFT according to the present invention may have a double gate structure in which two gate electrodes are disposed on two opposing sides of the semiconductor pattern 300.

When the TFT has a double gate structure, both of an upper channel portion and a lower channel portion of the semiconductor pattern 300 may be electrically controlled. Thus, a leakage current flowing through an upper portion of the semiconductor pattern 300 may be reduced, and a current gain at both an upper portion and a lower portion of the semiconductor pattern 300 may be obtained in a state when the TFT is turned on. This enhances charge mobility, thus increasing operating current (Ion).

Moreover, a slope prior to a threshold voltage (i.e., a sub-threshold swing) may be decreased. Here, the term "sub-threshold swing" is a gate voltage necessary for increasing a current (sub-threshold current) between a source electrode and a drain electrode by one digit. In this case, the "gate voltage" means a gate potential with respect to a source potential serving as a reference. Moreover, as shown in FIG. 4B, a variation of the threshold voltage over time is decreased, increasing the electrical stability and reliability of the TFT.

According to exemplary embodiments of the present invention, the second gate electrode 250 is included in the second conductive pattern 200 along with the source electrode 210 and the drain electrode 230. The source electrode 210, the drain electrode 230, the second gate electrode 250 are also formed from the same data conductive layer. As the second gate electrode 250 is proximate to the semiconductor pattern 300 (here, separated only by the second gate insulation layer 420), electrical characteristics of the semiconductor pattern may be more easily controlled.

If the second gate electrode 250 is formed over the upper insulation layer 470, the second gate electrode 250 is too far from the semiconductor pattern 300 to have the above-described beneficial effects. In contrast, when the second gate electrode 250 is formed from a data conductive layer forming the source and drain electrodes 210 and 230 (i.e., separated from the semiconductor pattern 300 only by second gate insulation layer 420, and thus in closer proximity to the semiconductor pattern 300), the above-described beneficial effects are achieved regardless of the thickness of the upper insulation layer 470, or any other overlying layers such as a color filter layer.

Referring to again FIGS. 1, 2 and 3, the second gate insulation layer 420 is disposed between the second gate electrode 250 and the semiconductor pattern 300. The second gate insulation layer 420 insulates the second gate electrode 250 from the semiconductor pattern 300. In this case, the source electrode 210 and the drain electrode 230 may each cover a portion of the semiconductor pattern 300 and a portion of the second gate insulation layer 420.

In an exemplary embodiment, when the semiconductor pattern 300 includes an oxide semiconductor, the second gate insulation layer 420 may be an etch stopper. The etch stopper may prevent the oxide semiconductor from being damaged or deteriorated by the etching solution used in wet etching processes, or the plasma used in dry etching processes. The etch stopper thus can prevent damage during the etching process for forming a second conductive pattern after the semiconductor pattern 300 is formed. The etch stopper may include an inorganic material of a silicon series such as a silicon oxide (SiOx), a silicon nitride (SiNx), etc. However, the material of the etch stopper layer is not limited to these materials, and can be any suitable etch-stopping composition.

The array substrate 600 may further include a first upper insulation layer 450 covering the source electrode 210, the drain electrode 230 and the second gate electrode 250. The first upper insulation layer 450 may act as a passivation layer that protects electrodes of the TFT. The first upper insulation layer 450 may include an inorganic material. However, a material of the first upper insulation layer 450 may also be made of any other suitable material.

The array substrate 600 may further include a second upper insulation layer 470 covering the first upper insulation layer 450. The second upper insulation layer 470 may have a greater thickness than that of the first upper insulation layer 450. The second upper insulation layer 470 includes an organic material. However, a material of the second upper insulation layer 470 may also be made of any other suitable material. In an exemplary embodiment, when the array substrate 600 has a color filter on array (COA) structure with a color filter layer formed on an array substrate that has a TFT formed thereon, the second upper insulation layer 470 may correspond to the color filter layer.

The pixel electrode 510 is electrically connected to the drain electrode 230. The pixel electrode 510 may include an optically transparent and electrically conductive material. In an exemplary embodiment, the pixel electrode 510 may be disposed on the second upper insulation layer 470, and may be electrically connected to the drain electrode 230 through a first contact hole CT1 penetrating both the first upper insulation layer 450 and the second upper insulation layer 470.

In the array substrate 600 according to this exemplary embodiment, the TFT may further include a connection electrode 530 which electrically connects the first gate electrode 110 and the second gate electrode 250. In an exemplary embodiment, the connection electrode 530 may electrically connect the second gate electrode 250 and the first gate electrode 110 through a second contact hole CT2 that extends through the first upper insulation layer 450, the second upper insulation layer 470 and the first gate insulation layer 410.

The connection electrode 530 may be formed from a third conductive layer different from the first and second conductive layers. For example, the connection electrode 530 may be formed from the same transparent conductive layer used to form the pixel electrode 510. That is, the connection electrode 530 may include an optically transparent and electrically conductive material. The third conductive pattern may include the pixel electrode 510 and the connection electrode 530. Examples of the optically transparent and electrically conductive material forming the third conductive pattern are indium tin oxide (ITO), indium zinc oxide (IZO), aluminum doped zinc oxide (AZO), or the like. Alternatively, the connection electrode 530 may be formed from a metal layer different from the conductive layer forming the pixel electrode 510. However, a material of the pixel electrode 510 and a material of the connection electrode 530 may be made of any suitable material(s).

As described above, according to the TFT and the array substrate 600 of exemplary embodiments of the present invention, the TFT includes two gate electrodes disposed at two opposing sides of the semiconductor pattern 300, so as to be electrically connected to each other. That is, the TFT has a double gate structure. Moreover, the second gate electrode 250 is included in the second conductive pattern 200 along with the source electrode 210 and the drain electrode 230, i.e. all three structures 210, 230, 250 are formed from the same conductive layer. Thus, the TFT may retain its beneficial double gate structure even though a relatively thick upper insulation layer 470 or a color filter layer is formed above it.

FIGS. 4A, 4B, 4C and 4D are cross-sectional views showing a method of manufacturing an array substrate of FIG. 1.

Since the array substrate 600 shown in FIG. 1 has TFTs, the method of manufacturing the array substrate 600 includes the fabrication of the TFTs shown in FIG. 1.

Figure 4A:
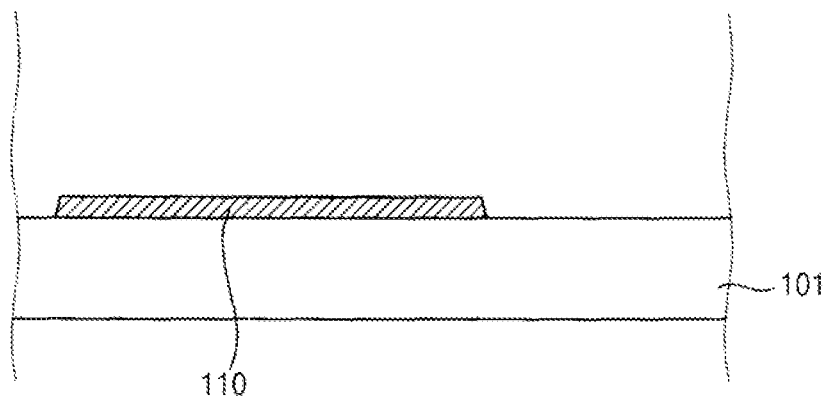
FIGS. 4A, 4B, 4C and 4D are cross-sectional views taken along a line II-II' of FIG. 1 showing a method of manufacturing an array substrate of FIG. 1.
Figure 4B:
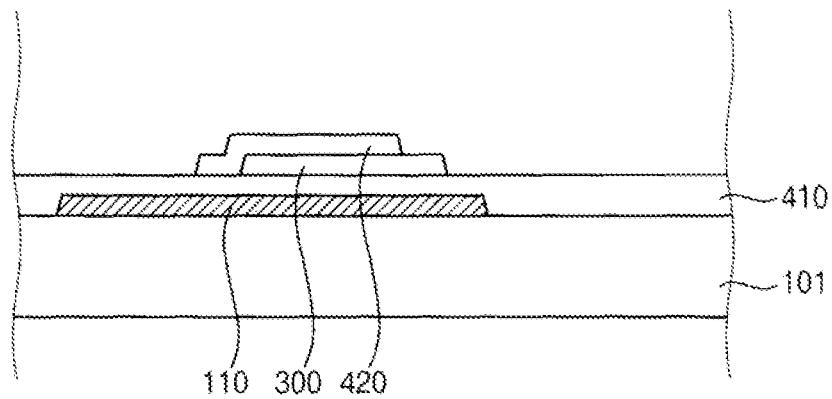

Referring to FIG. 4A, a first conductive layer formed on a substrate 101 is patterned to form a first conductive pattern which includes a first gate electrode 110. For example, the first conductive layer is formed on the substrate 101 by using a sputtering process, and the first conductive layer is patterned by using a photolithography process (typically including a developing process and an etching process) to form the first conductive pattern. In this case, in order to pattern the first conductive layer, one mask (i.e., a first mask) is used.

The first conductive pattern includes, for example, a metal such as aluminum (Al), copper (Cu), molybdenum (Mo), titanium (Ti), etc., or a metal alloy thereof. Moreover, the first conductive pattern may include an optically transparent and electrically conductive material such as indium tin oxide (ITO), indium zinc oxide (IZO), aluminum doped zinc oxide (AZO), etc. However, a material of the first conductive pattern is not limited to the above, and may be any suitable material. The first conductive pattern may have a single layer structure, or alternatively may have a multiple layer structure with plural conductive layers, or plural conductive layers and plural insulation layers.

Referring to FIG. 4B, a first gate insulation layer 410 is formed on the substrate 101 to cover the first gate electrode 110. The first gate insulation layer 410 may include an inorganic insulation material or an organic insulation material. For example, the first gate insulation layer 410 may include an inorganic insulation material such as a silicon oxide (SiOx), a silicon nitride (SiNx), an aluminum oxide (AlOx), a barium oxide (BaOx), a magnesium oxide (MgOx), a hafnium oxide (HfOx), a zirconium oxide (ZrOx), a calcium oxide (CaOx), a strontium oxide (SrOx), an yttrium oxide (YOx), an aluminum nitride (AlNx), a gallium nitride (GaNx), a zinc sulfide (ZnSx), a cadmium sulfide (CdSx), etc. The first gate insulation layer 410 may have a double layer structure in which a silicon nitride (SiNx) layer and a silicon oxide (SiOx) layer are both deposited thereon. Alternatively, the first gate insulation layer 410 may include an organic insulation layer such as benzocyclobutene (BCB), polyimide, parylene, polyvinylphenol (PVP), etc. However, a material of the first gate insulation layer 410 is not limited to any of the above, and may be any suitable material or materials.

A semiconductor pattern 300 is then formed on the first gate insulation layer 410. For example, a semiconductor layer including a semiconductor material is formed on the first gate insulation layer 410, and the semiconductor layer is patterned by using a photolithography process (typically including a developing process and an etching process) to form the semiconductor pattern 300. In this case, in order to pattern the semiconductor layer, another mask (i.e., a second mask) is used.

The semiconductor pattern 300 may include an oxide semiconductor material. The oxide semiconductor material include a zinc oxide, tin oxide, Ga—In—Zn oxide, In—Zn oxide, In—Sn oxide, In—Ga—Zn oxide, In—Zn—Sn oxide, In—Ga—Zn—Sn oxide, etc. These materials may be used alone or in any combination. Moreover, a metal such as aluminum (Al), nickel (Ni), copper (Cu), tantalum (Ti), molybdenum (Mo), hafnium (Hf), titanium (Ti), niobium (Nb), chromium (Cr), tungsten (W), etc., may be doped into these oxide semiconductor material. However, the oxide semiconductor material is not limited to any of the above, and can be any suitable material or materials.

Next, a second gate insulation layer 420 is formed on the semiconductor pattern 300. For example, an insulation layer including an insulation material is formed on the semiconductor pattern 300, and the insulation layer is patterned by using a photolithography process to form the second gate insulation layer 420. In this case, in order to pattern the insulation layer, another mask (i.e., a third mask) is used. The second gate insulation layer 420 may include an inorganic material of a silicon series such as a silicon oxide (SiOx), a silicon nitride (SiNx), etc. However, the material of the second gate insulation layer 420 is not limited to the above, and may be any suitable material.

Figure 4C:
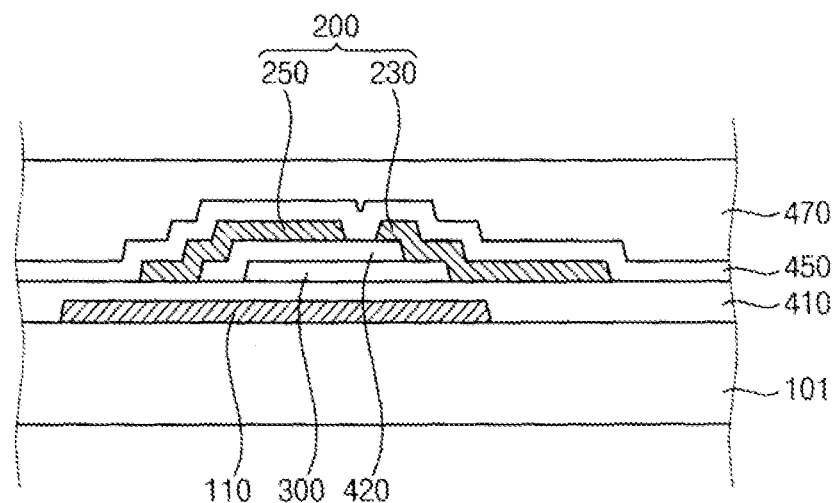

Referring to FIG. 4C, a second conductive layer is patterned on the second gate insulation layer 420 to form a second conductive pattern which includes a source electrode (not shown), a drain electrode 230 and a second gate electrode 250. For example, the second conductive layer is formed on the second gate insulation layer 420 through a sputtering process, and then the second conductive layer is patterned by using a photolithography process to form the second conductive pattern. This second conductive pattern includes the source electrode, the drain electrode 230 and the second gate electrode 250. In this case, in order to pattern the second conductive layer, another mask (i.e., a fourth mask) is used. The second conductive pattern may include a metal such as aluminum (Al), copper (Cu), molybdenum (Mo), titanium (Ti), etc., or a metal alloy thereof. The second conductive pattern may include an optically transparent and electrically conductive material such as indium tin oxide (ITO), indium zinc oxide (IZO), aluminum doped zinc oxide (AZO), etc. However, a material of the second conductive pattern is not limited to the above, and can be any suitable material. The second conductive pattern may have a single layer structure, or a multiple layer structure in which plural conductive layers are deposited, or plural conductive layers and plural insulation layers are deposited.

A first upper insulation layer 450 is formed to cover the second conductive pattern. The first upper insulation layer 450 may include an inorganic material. However, a material of the first upper insulation layer 450 is not limited to an inorganic material, and may comprise any suitable material.

A second upper insulation layer 470 is formed to cover the first upper insulation layer 450. The second upper insulation layer 470 may include an organic material or any other suitable material.

Figure 4D:
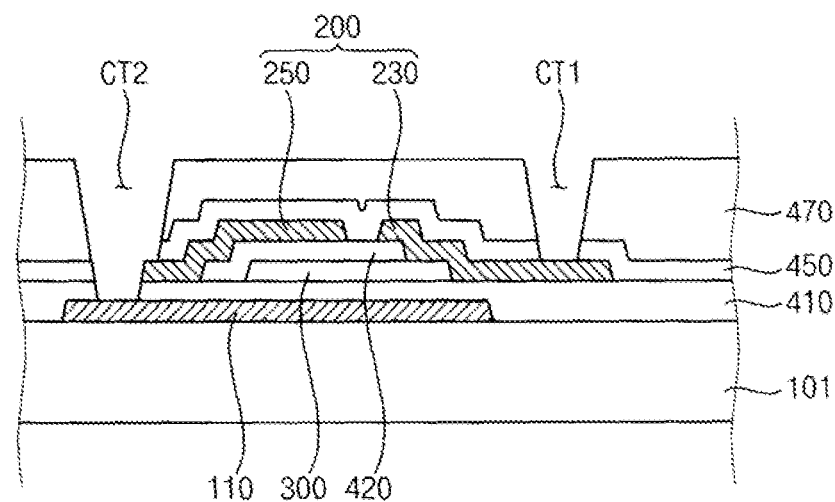

Referring to FIG. 4D, the first gate insulation layer 410, the first upper insulation layer 450 and the second upper insulation layer 470 are patterned to form a first contact hole CT1 and a second contact hole CT2. The first contact hole CT1 extends through the first upper insulation layer 450 and the second upper insulation layer 470 to expose a portion of the drain electrode 230. Moreover, the second contact hole CT2 extends through the first gate insulation layer 410, the first upper insulation layer 450 and the second upper insulation layer 470 to expose a portion of the first gate electrode 110 and a portion of the second gate electrode 250. In this case, in order to pattern the first gate insulation layer 410, the first upper insulation layer 450 and the second upper insulation layer 470, another mask (i.e., a fifth mask) is used.

A transparent conductive layer is formed on the second upper insulation layer 470, the exposed drain electrode 230, the exposed first gate electrode 110 and the exposed second gate electrode 250, and then the transparent conductive layer is patterned to form the pixel electrode 510 and the connection electrode 530 shown in FIG. 3. That is, the transparent conductive layer is deposited and patterned to form the pixel electrode 510 and the connection electrode. In this case, the pixel electrode 510 is electrically connected to the drain electrode 230 through the first contact hole CT1. The connection electrode 530 is electrically connected to the first gate electrode 110 and the second gate electrode 250 through the second contact hole CT2. In this case, in order to pattern the transparent conductive layer, another mask (i.e., a sixth mask) is used.

Figure 5:
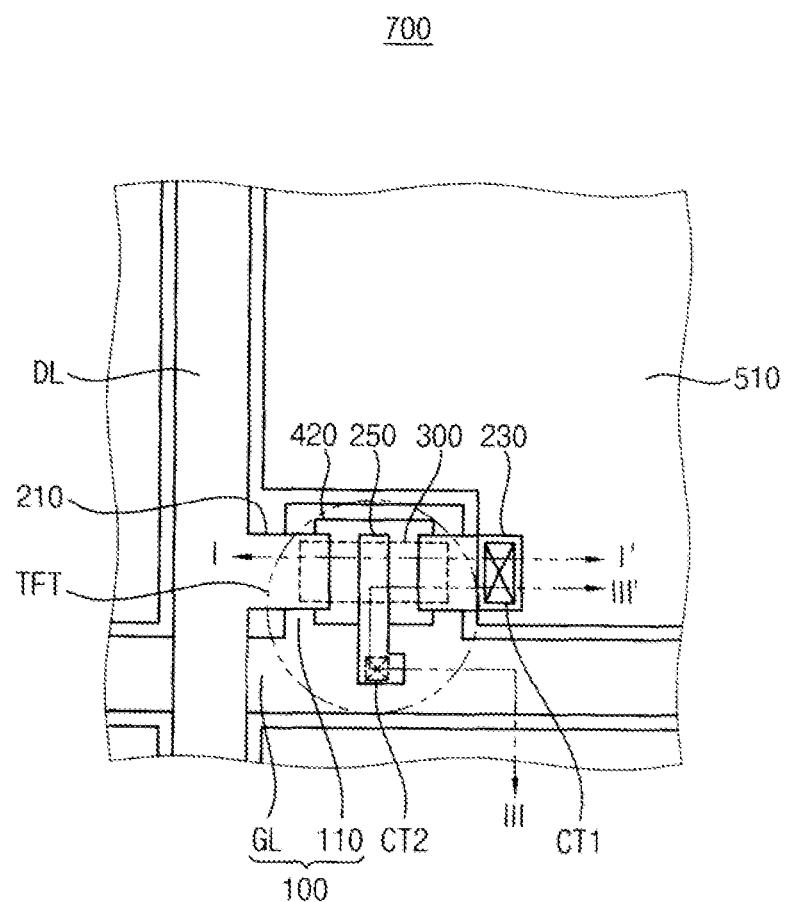
FIG. 5 is a plan view illustrating an array substrate according to another exemplary embodiment of the present invention.
Figure 6:
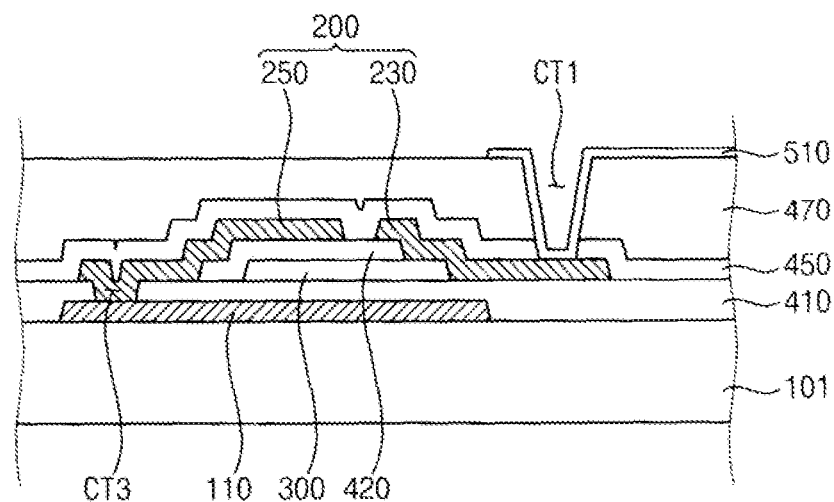
FIG. 6 is a cross-sectional view taken along a line III-III' of FIG. 1.

FIG. 5 is a plan view illustrating an array substrate according to another exemplary embodiment of the present invention. FIG. 6 is a cross-sectional view taken along a line III-III' of FIG. 1.

A cross-sectional view of the array substrate taken along a line I-I' of FIG. 5 is substantially identical to the cross-sectional view shown in FIG. 2.

The array substrate 700 of FIGS. 5 and 6 is substantially the same as the array substrate 600 of FIGS. 1 to 3, except for at least that a second gate electrode 250 makes direct contact with first gate electrode 110. Thus, identical reference numerals are used in FIGS. 5 and 6 to refer to components that are the same or similar to those shown in FIGS. 1 to 3, and a detailed description thereof will be omitted.

Referring to FIGS. 2, 5 and 6, the array substrate 700 of this embodiment of the present invention includes a gate line GL, a data line DL, a TFT and a pixel electrode 510.

The TFT includes a first gate electrode 110, a semiconductor pattern 300, a source electrode 210, a drain electrode 230 and a second gate electrode 250.

The first gate electrode 110 is electrically connected to the gate line GL. More specifically, the first gate electrode 110 may have an extension protruding from the gate Line GL. In this case, the first gate electrode 110 is formed to be integrated with the gate line GL, so that no clear boundary exists between the first gate electrode 110 and the gate line GL. The gate line GL and the first gate electrode 110 are included in a first conductive pattern 100 formed from a first conductive layer (i.e., a gate conductive layer). That is, the first conductive pattern 100 corresponds to a gate conductive pattern including the gate line GL and the first gate electrode 110. A first gate insulation layer 410, which covers the first gate electrode 110, is formed on the first gate electrode 110.

The semiconductor pattern 300 is disposed on the first gate insulation layer 410 and over an upper portion of the first gate electrode 110. The semiconductor pattern 300 is used as a TFT channel layer. The semiconductor pattern 300 may include an oxide semiconductor material.

A source electrode 210 is electrically connected to the semiconductor pattern 300. A drain electrode 230 is spaced apart from the source electrode 210 to be electrically connected to the semiconductor pattern 300. The data line DL, the source electrode 210 and the drain electrode 230 are included in a second conductive pattern 200 formed from a data conductive layer. That is, the second conductive pattern 200 corresponds to a data conductive pattern including the data line DL, the source electrode 210 and the drain electrode 230.

The second gate electrode 250 is respectively insulated from the semiconductor pattern 300, the source electrode 210 and the drain electrode 230, and is electrically connected to the first gate electrode 110. According to the exemplary embodiment of FIGS. 5 and 6, the second gate electrode 250 directly contacts the first gate electrode 110. Thus, the second gate electrode 250 may electrically synchronize with the first gate electrode 110, i.e. the two gate electrodes 110, 250 may deliver largely the same signal at the same time. In an exemplary embodiment, the second gate electrode 250 makes a direct contact with the first gate electrode 110 through a third contact hole CT3 in the first gate insulation layer 410. The first gate electrode 110 is disposed below the semiconductor pattern 300, and the second gate electrode 250 is disposed above the semiconductor pattern 300. Thus, the TFT of this embodiment has a double gate structure in which two gate electrodes are disposed at two opposing sides of the semiconductor pattern 300.

The second gate electrode 250 is included in the second conductive pattern 200. That is, the second gate electrode 250 is formed from the data conductive layer. In other words, the second conductive pattern 200 further includes the second gate electrode 250. When the second gate electrode 250 is formed from the data conductive layer, the second gate electrode 250 is near the semiconductor pattern 300 so that electric characteristics of the semiconductor pattern may be more easily controlled. Thus, the beneficial effects of a double gate structure may be obtained even if a relatively thick upper insulation layer 470 or a color filter layer is formed on an upper portion of the TFT.

A second gate insulation layer 420 may be disposed between the second gate electrode 250 and the semiconductor pattern 300. The second gate insulation layer 420 insulates the second gate electrode 250 from the semiconductor pattern 300. In this case, the source electrode 210 and the drain electrode 230 may respectively cover a portion of the semiconductor pattern 300 and a portion of the second gate insulation layer 420. In an exemplary embodiment, when the semiconductor pattern 300 includes an oxide semiconductor material, the second gate insulation layer 420 may be an etch stopper.

The array substrate 700 may further include a first upper insulation layer 450 covering the source electrode 210, the drain electrode 230 and the second gate electrode 250. The first upper insulation layer 450 may act as a passivation layer that protects electrodes of the TFT. The array substrate 700 may further include a second upper insulation layer 470 covering the first upper insulation layer 450. In an exemplary embodiment, when the array substrate 700 has a COA structure in which a color filter layer is formed on an array substrate having a TFT formed thereon, the second upper insulation layer 470 may correspond to the color filter layer.

The pixel electrode 510 is electrically connected to the drain electrode 230. In an exemplary embodiment, the pixel electrode 510 may be electrically connected to the drain electrode 230 through a first contact hole CT1 (which extends through the first upper insulation layer 450 and the second upper insulation layer 470).

The TFT of this embodiment has a double gate structure. Moreover, the second gate electrode 250 is included in the second conductive pattern 200, which together with electrodes 210, 230 are formed from the data conductive layer. Thus, the TFT of this embodiment exhibits the beneficial effects of a double gate structure even if a relatively thick upper insulation layer 470 or a color filter layer is formed on an upper portion of the TFT.

FIGS. 7A, 7B, 7C and 7D are cross-sectional views showing a method of manufacturing an array substrate of FIG. 5, including its TFTs, in accordance with an exemplary embodiment of the present invention.

The method of manufacturing the array substrate of FIGS. 7A to 7D is substantially the same as the method of manufacturing the array substrate of FIGS. 4A to 4D, except for at least that a third contact hole CT3 is formed through first gate insulation layer 410 and a second gate electrode 250 makes direct contact with first gate electrode 110. Thus, identical reference numerals are used in FIGS. 4A to 4D to refer to components that are the same or similar to those shown in FIGS. 1 to 3, and a detailed description thereof will be omitted.

Figure 7A:
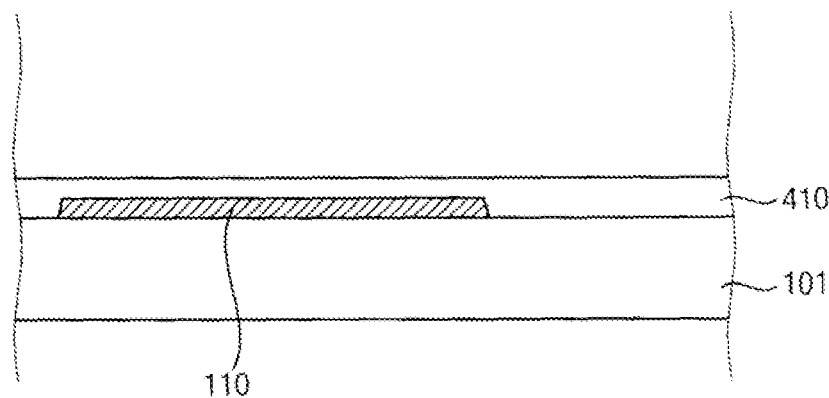
FIGS. 7A, 7B, 7C and 7D are cross-sectional views taken along a line III-III' of FIG. 5 showing a method of manufacturing an array substrate of FIG. 5 in accordance with an exemplary embodiment of the present invention.

Referring to FIG. 7A, a first conductive layer is formed on a substrate 101 and patterned to form a first conductive pattern including a first gate electrode 110. For example, the first conductive layer is formed on the substrate 101, and the first conductive layer is patterned by using a photolithography process so as to form the first conductive pattern including the first gate electrode 110. In this case, in order to pattern the first conductive layer, one mask (i.e., a first mask) is used. A first gate insulation layer 410 then formed over the first gate electrode 110.

Figure 7B:
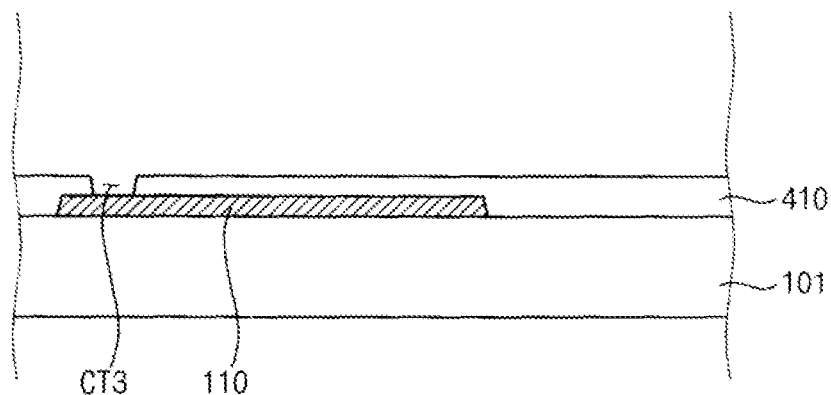

Referring to FIG. 7B, the first gate insulation layer 410 is patterned to form a third contact hole CT3 through the first gate insulation layer 410 to expose a portion of the first gate electrode 110. For example, the first gate insulation layer 410 is patterned by using a photolithography process to form third contact hole CT3 extending through the first gate insulation layer 410. In this case, in order to pattern the first gate insulation layer 410, another mask (i.e., a second mask) is used. Alternatively, one mask instead of two masks (that is, the first mask and the second mask) is used to form the gate electrode 110 and the third contact hole CT3 of the first gate electrode 110. A method of manufacturing the gate electrode 110 and the third contact hole CT3 using one mask will be explained in detail with reference to FIGS. 8A to 8G.

Figure 7C:
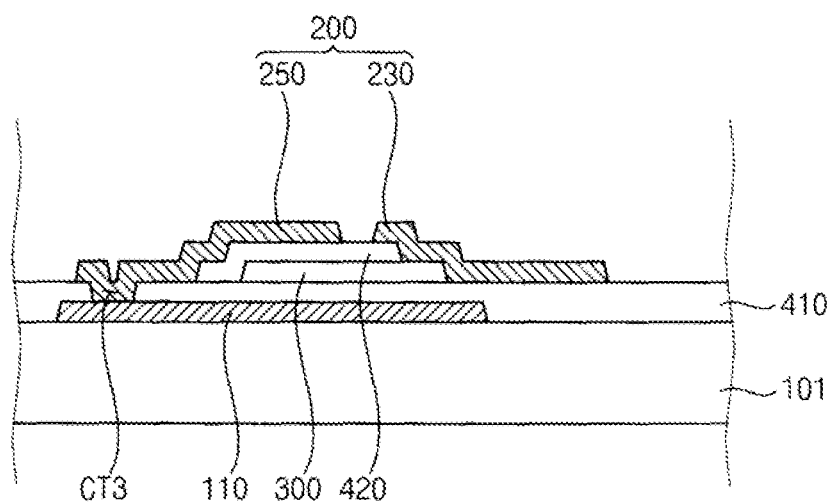

Referring to FIG. 7C, a semiconductor pattern 300 is formed on the first gate insulation layer 410, including within the third contact hole CT. To accomplish this, a semiconductor layer is formed on the first gate insulation 410, and then the semiconductor layer is patterned through a photolithography process to form the semiconductor pattern 300. In this case, in order to pattern the semiconductor layer, another mask (i.e., a third mask) is used. The semiconductor pattern 300 may include an oxide semiconductor.

Next, a second gate insulation layer 420 is formed on the semiconductor pattern 300. For example, an insulation layer including an insulation material is formed on the semiconductor pattern 300, and then the insulation layer is patterned by using a photolithography process to form the second gate insulation layer 420. In this case, in order to pattern the insulation layer, another mask (i.e., a fourth mask) is used.

A second conductive layer is then formed on the second gate insulation layer 420 and patterned to form a second conductive pattern that includes a source electrode (not shown), a drain electrode 230 and a second gate electrode 250. For example, a second conductive layer is formed on the second gate insulation layer 420, and then the second conductive layer is patterned via a photolithography process to form the second conductive pattern. In this case, in order to pattern the second conductive layer, another mask (i.e., a fifth mask) is used.

Figure 7D:
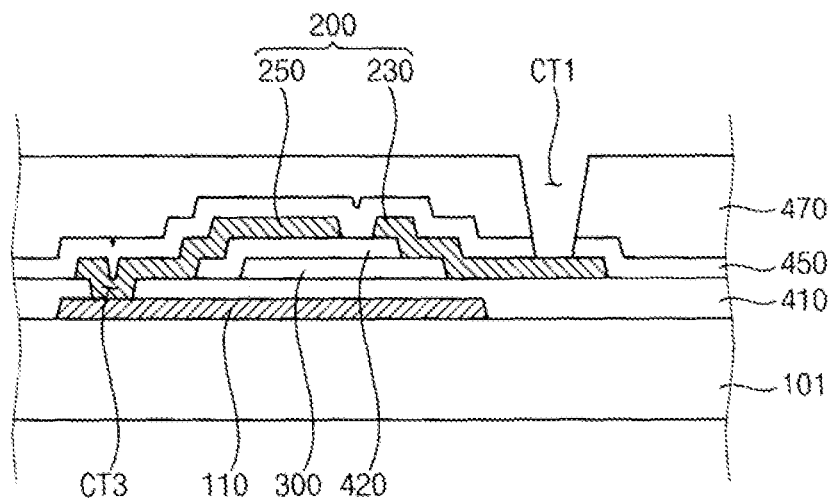

Referring to FIG. 7D, a first upper insulation layer 450 is formed to cover the second conductive pattern. In addition, a second upper insulation layer 470 is formed to cover the first upper insulation layer 450. Moreover, the first and second upper insulation layers 450 and 470 are patterned to form a first contact hole CT1. The first contact hole CT1 extends through the first and second upper insulation layers 450 and 470 to expose a portion of the drain electrode 230. In this case, in order to pattern the first and second upper insulation layers 450 and 470, another mask (i.e., a sixth mask) is used.

A transparent conductive layer is formed on the second upper insulation layer 470 and the exposed drain electrode 230, and the transparent conductive layer is then patterned to form a pixel electrode 510 as shown in FIG. 6. That is, the transparent conductive layer is patterned to form the pixel electrode 510 on the second upper insulation layer 470 and the exposed drain electrode 230, where this pixel electrode 510 is electrically connected to the drain electrode 230 through the first contact hole CT1. In this case, in order to pattern the transparent conductive layer, another mask (i.e., a seventh mask) is used.

FIGS. 8A, 8B, 8C, 8D, 8E, 8F and 8G are cross-sectional views showing a method of manufacturing a TFT of FIG. 5 in accordance with another exemplary embodiment of the present invention. More specifically, FIGS. 8A, 8B, 8C, 8D, 8E, 8F and 8G are cross-sectional views for explaining a method of forming a third contact hole CT3 through a first gate insulation layer 410 with fewer masks, in accordance with another exemplary embodiment of the present invention.

As explained in connection with FIGS. 4A to 4D, six masks are used in the method of manufacturing the array substrate 600 of FIG. 1. However, as explained referring to FIGS. 7A to 7D, the method of manufacturing the array substrate 700 of FIG. 5 uses seven masks. Increasing the number of masks tends to increase process time and manufacturing cost for the array substrate. Thus, a method of manufacturing the third contact hole CT3 without adding masks is desirable.

Figure 8A:
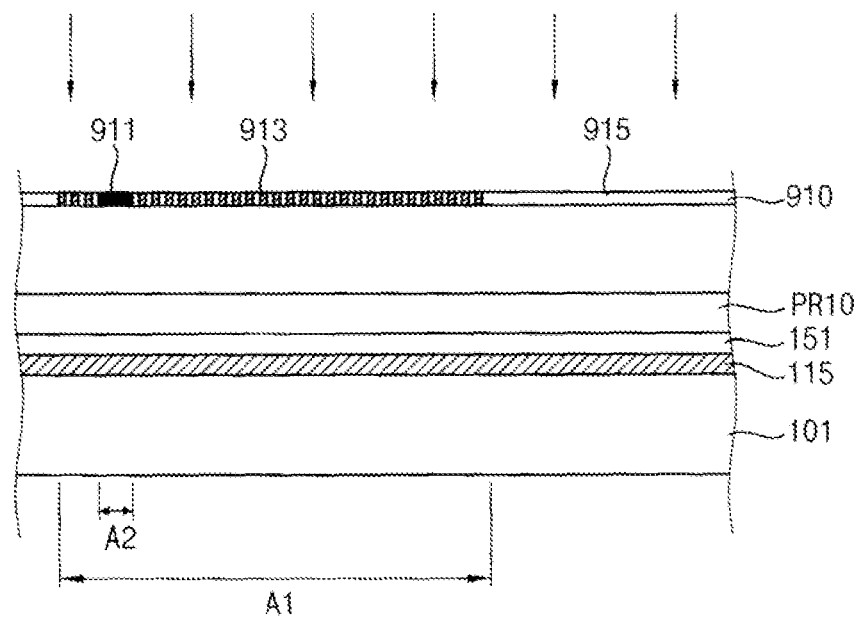
FIGS. 8A, 8B, 8C, 8D, 8E, 8F and 8G are cross-sectional views taken along a line III-III' of FIG. 5 showing a method of manufacturing a thin-film transistor of FIG. 5 in accordance with another exemplary embodiment of the present invention.

Referring to FIG. 8A, a first conductive layer 115 is formed on a substrate 101, and then a sacrifice layer 151 is formed on the first conductive layer 115.

The first conductive layer 115 may be formed on the substrate 101, for example, by using a sputtering process. The first conductive layer 115 may include a metal such as aluminum (Al), copper (Cu), molybdenum (Mo), titanium (Ti), etc., or a metal alloy thereof. Moreover, the first conductive layer 115 may include an optically transparent and electrically conductive material such as indium tin oxide (ITO), indium zinc oxide (IZO), aluminum doped zinc oxide (AZO), etc. However, the first conductive layer 115 is not limited to any of the above, and may include any suitable materials. Additionally, the first conductive layer 115 may have a single layer structure or a multiple layer structure with plural conductive layers, or plural conductive layers and plural insulation layers.

The sacrifice layer 151 may include a metal such as aluminum (Al), copper (Cu), molybdenum (Mo), titanium (Ti), etc., or a metal alloy thereof. Moreover, the sacrifice layer 151 may include an optically transparent and electrically conductive material such as indium tin oxide (ITO), indium zinc oxide (IZO), aluminum doped zinc oxide (AZO), etc. In this case, the sacrifice layer 151 and the first conductive layer 115 may be formed from different materials having different etching selectivities. The differing etching selectivities mean that the same process etches the two layers at different rates. That is, two materials are simultaneously etched when a predetermined etching process is performed, and one of two materials is etched when another predetermined etching process different from the predetermined etching process is performed.

A photoresist layer PR10 is formed on the sacrifice layer 151. In an exemplary embodiment of FIG. 8A, the photoresist layer PR10 is a positive photoresist material for which the developing process removes that portion which is exposed to light.

A mask 910 is disposed on the photoresist layer PR10, and then light is irradiated on the photoresist layer PR10. The mask 910 includes a light-blocking portion 911, a slit portion 913 and a light-transmitting portion 915. The light-blocking portion blocks light, and the light-transmitting portion 915 transmits light. The slit portion 913 is an area where light is diffracted, or partially transmitted and partially blocked.

When the photoresist layer PR10 includes a positive photoresist material, the light-blocking portion 911 and the slit portion 913 are disposed on a first area A1 corresponding to a position where the first gate electrode 110 of FIGS. 5 and 6 will be formed. Additionally, the light-blocking portion 911 is disposed on a second area A2 corresponding to a position where the third contact hole CT3 of FIGS. 5 and 6 will be formed. As shown in FIGS. 5 and 6, the third contact hole CT3 is formed on the first gate electrode 110, so that the first area A1 includes the second area A2.

Figure 8B:
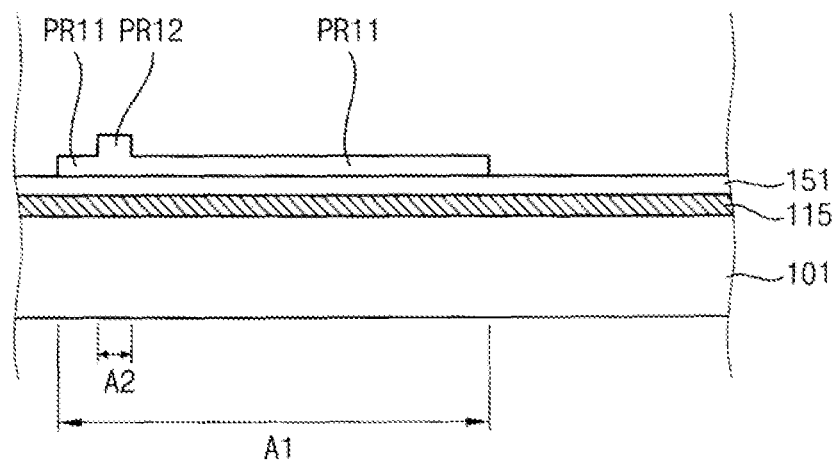

Referring to FIGS. 8A and 8B, the photoresist layer PR10 is developed to form a first photo pattern PR11 in the first area A1, and to form a second photo pattern PR12 in the second area A2. More specifically, in the developing process, the portions of the photoresist layer PR10 that are exposed through the light-transmitting portion 915 are removed by a developing material such as a developing solution. Moreover, the photoresist layer PR10 partially exposed by the slit portion 913 corresponding to the first area A1 is partially removed to form the first photo pattern PR11. The photoresist layer PR10 which is blocked by the light-blocking portion 911 remains to form the second photo pattern PR12. That is, a thickness of the first photo pattern PR11 is thinner than that of the photoresist layer PR10; however, the thickness of the second photo pattern PR12 may be substantially equal to that of the photoresist layer PR10. Accordingly, the thickness of the second photo pattern PR12 is thicker than that of the first photo pattern PR11.

The embodiment of FIGS. 8A and 8B employs a positive photoresist in which exposed portions are removed. Alternatively, a negative photoresist may be used, in which exposed portions remain. When a negative photoresist is used, the positions of the light-blocking portion 911 and the light-transmitting portion 915 are reversed in the mask 910.

Figure 8C:
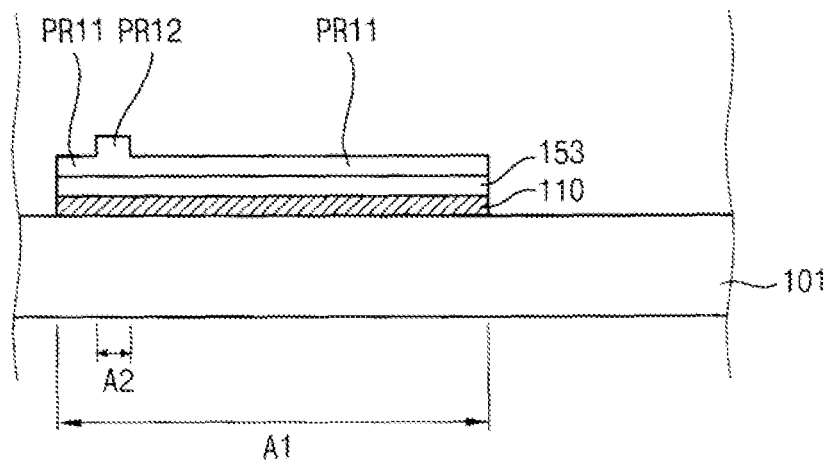

Referring to FIGS. 8B and 8C, the first conductive layer 115 and a portion of the sacrifice layer 151, which are not shielded by the first photo pattern PR11 and the second photo pattern PR12, are etched to form the first gate electrode 110 and the sacrifice pattern 153 on the first area A1. The first conductive layer 115 and the sacrifice layer 151 may be etched by a wet etching process or a dry etching process. When a wet etching process is performed to etch the first conductive layer 115 and a portion of the sacrifice layer 151, an etching solution may be used. Alternatively, when a dry etching process is performed to etch the first conductive layer 115 and a portion of the sacrifice layer 151, plasma or an ion beam may be used.

Figure 8D:
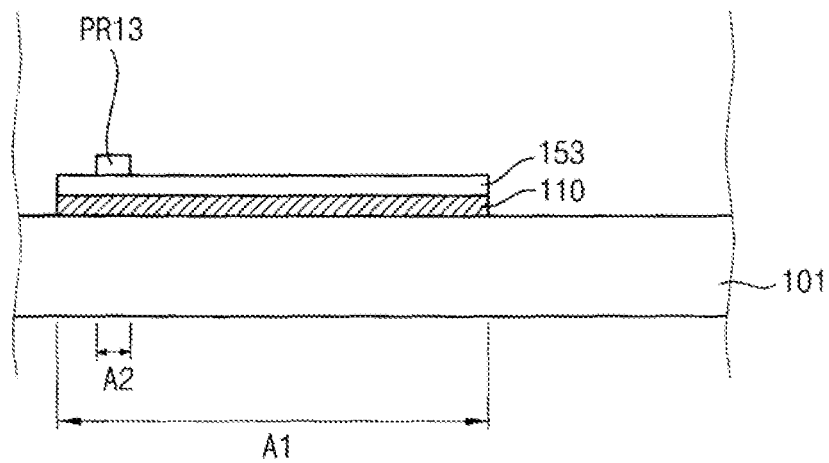

Referring to FIGS. 8C and 8D, the first photo pattern PR11 is removed to expose a sacrifice pattern 153 formed on the first area A1 but not the second area A2, and a portion of the second photo pattern PR12 formed on the second area A2 is removed to form a remaining sacrifice pattern PR13. For example, an upper portion of the second photo pattern PR12 may be removed through an etch back process or an ashing process, until the first photo pattern PR11 is entirely removed. Since a thickness of the second photo pattern PR12 is thicker than a thickness of the first photo pattern PR11, even though the first photo pattern PR11 is entirely removed, a portion of the second photo pattern PR12 remains on the second area A2 to form the remaining sacrifice pattern PR13.

Figure 8E:
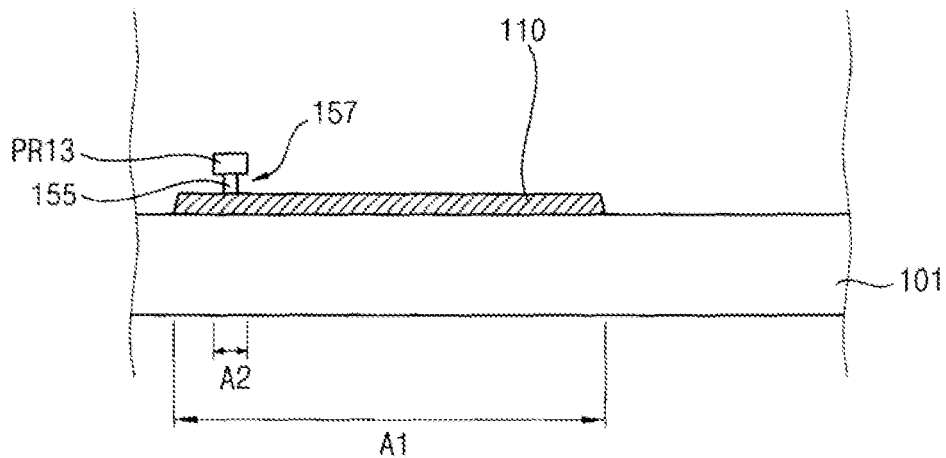

Referring to FIGS. 8D and 8E, the sacrifice pattern 153 that is in area A1 but not area A2 is removed to form a remaining sacrifice pattern 155 in the second area A2. The sacrifice pattern 153 formed in the second area A2 is shielded by the remaining photo pattern PR13, so that part of the sacrifice pattern 153 remains, and forms the remaining sacrifice pattern 155. In this case, a portion of the etchant that etches the sacrifice pattern 153 of FIG. 8D may infiltrate a lower portion of the remaining photo pattern PR13. Thus, etching the sacrifice pattern 153 results in an undercut 157 at a side surface of the remaining sacrifice pattern 155.

Figure 8F:
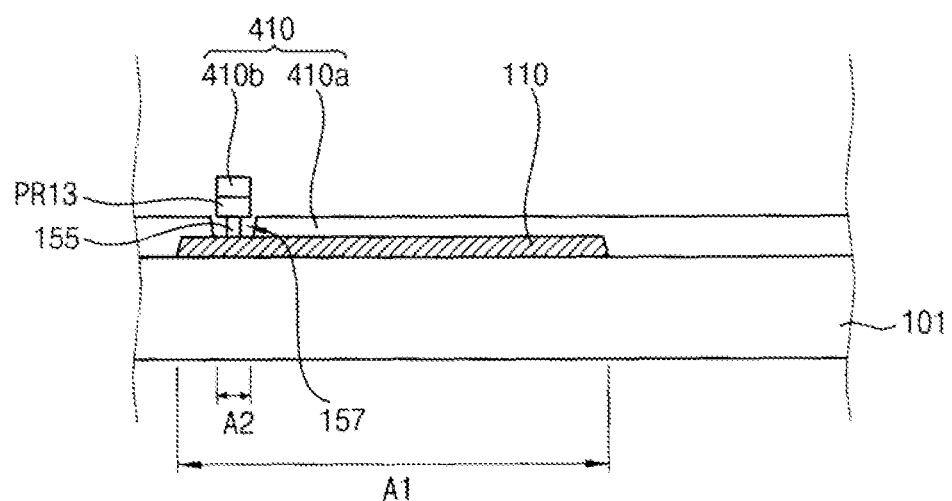

Referring to FIGS. 8E and 8F, a first gate insulation layer 410 is formed over the first gate electrode 110, the remaining sacrifice pattern 155 and the remaining photo pattern PR13. In this case, the remaining photo pattern PR13 is formed on the second area A2, so that the first gate insulation layer 410 may be divided into a first portion 410a formed on the substrate or the first gate electrode 110, and a second portion 410b formed on the remaining photo pattern PR13.

Figure 8G:
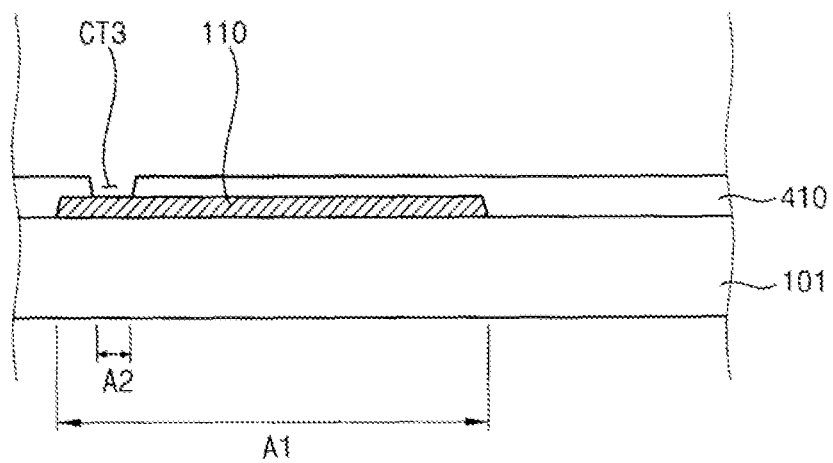

Referring to FIGS. 8F and 8G, the structures formed on the second area A2 (i.e., the remaining photo pattern PR13 and the second portion 410b formed thereon) are removed to form a third contact hole CT3 on the second area A2. For example, an etching solution can be applied, which infiltrates into the remaining sacrifice pattern 155 through the undercut 157 and removes the remaining sacrifice pattern 155. As the remaining sacrifice pattern 155 is removed, the structures above it (i.e., remaining photo pattern PR13 and the second portion 410b of the first gate insulation layer) are also removed. Thus, the third contact hole CT3 is formed on the second area A2.

According to the method of forming the third contact hole CT3 explained by FIGS. 8A to 8G, the first gate electrode 110 and the third contact hole CT3 may be formed by using one mask. Thus, the array substrate 700 shown in FIG. 5 may be manufactured by using six masks, tone less than the process of FIGS. 7A to 7D.

Figure 9A:
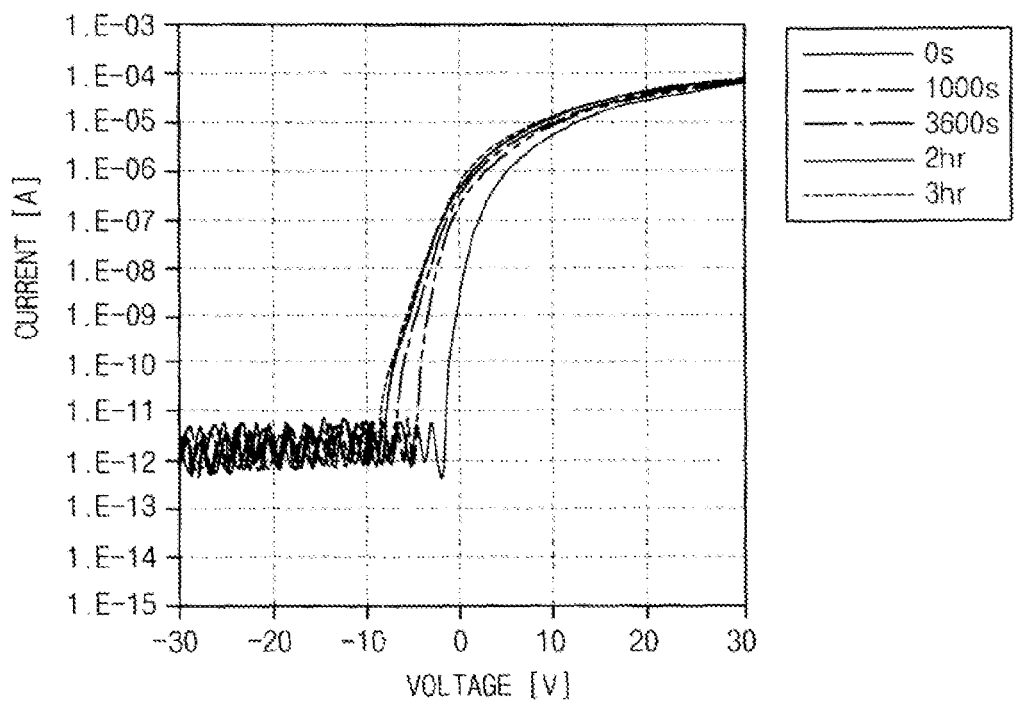
FIG. 9A is graphs showing current-voltage characteristics of an oxide semiconductor TFT having a single gate structure in accordance with a comparative embodiment.
Figure 9B:
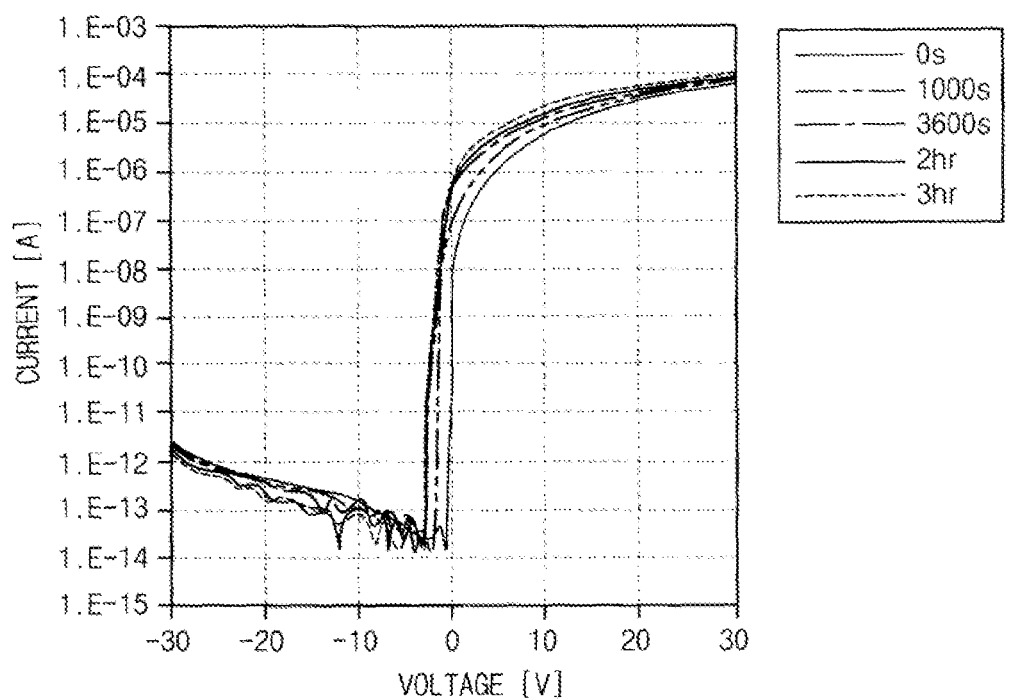
FIG. 9B is graphs showing current-voltage characteristics of an oxide semiconductor TFT having a double gate structure in accordance with an exemplary embodiment of the present invention.

A TFT constructed according to embodiments of the current invention was tested against a conventional single-gate-structure TFT, and the results are summarized in FIGS. 9A-9B. FIG. 9A is a graph showing current-voltage characteristics of an oxide semiconductor TFT having a single gate structure. FIG. 9B is a graph showing current-voltage characteristics of an oxide semiconductor TFT having a double gate structure in accordance with an exemplary embodiment of the present invention.

In the single-gate-structure TFT, each of the gate electrode, the source electrode and the drain electrode has a double layer structure in which a copper (Cu) layer of about 300 nm is deposited on a titanium (Ti) layer of about 30 nm. The gate insulation layer has a double layer structure in which a silicon oxide (SiOx) material of about 50 nm is deposited on a silicon nitride (SiNx) of about 400 nm. Moreover, an In—Ga—Zn—Sn oxide material having a thickness of about 200 nm was used as the oxide semiconductor pattern. Furthermore, a silicon nitride (SiNx) material having a thickness of about 200 nm was used as the first upper insulation layer, and an indium zinc oxide (IZO) layer having a thickness of about 90 nm was used as the pixel electrode.

The double-gate-structure TFT tested was substantially the same as a structure of the TFT according the embodiment of FIGS. 1 to 3. Each of a first gate electrode, a source electrode, a drain electrode and a second gate electrode has a double layer structure in which copper (Cu) layer of about 300 nm is deposited on a titanium (Ti) layer of about 30 nm. Conditions such as materials, thickness, etc., of a gate insulation layer, an oxide semiconductor pattern, a first upper insulation layer and a pixel electrode were identical to those conditions of the single-gate-structure TFT.

In order to test in a similar environment to a liquid crystal display (LCD) device whose backlight is turned on, a negative bias illumination stress (NBIS) test was performed with respect to the two TFTs. In the present exemplary embodiment, the NBIS test means that a negative bias voltage is applied to the TFTs to simulate backlight illumination, and then a stress amount applied to the TFT is measured.

In the NBIS test, a voltage (Vgs) between a gate electrode and a source electrode for each of two TFTs was varied from −30 V to +30 V, and a current (Id) flowing through a drain electrode was measured. In order to apply a stress to the two TFTs, a voltage (Vg) of about −20 V was applied to each of the gate electrodes, and a voltage (Vd) of about 10 V was applied to each of the drain electrodes. Once the stress was applied to the two TFTs, the voltage (Vgs) between the gate electrode and the source electrode was varied from about −30 V to about +30 V to measure a current (Id) flowing through the drain electrodes of the TFTs, at elapsed times of 1,000 seconds (1,000 s), 3,600 seconds (3,600 s), two hours (2 hr) and three hours (3 hr).

In FIGS. 9A and 9B, the horizontal axis represents voltage (Vgs) between the gate electrode and source electrode of the TFT, and the vertical axis represents current (Id) flowing through the drain electrode of the corresponding TFT.

As shown in FIG. 9A, in the single-gate-structure TFT, over an elapsed time of three hours, a threshold voltage varied by about −5.5 V. That is, it is recognized that the single-gate-structure did not exhibit desirable stability in its electrical characteristics. When this TFT has the current-voltage characteristics shown in FIG. 9A, the TFT may not always operate at a turn off voltage (Voff) of about −5 V over time. Thus, the TFT may not be considered reliable.

In contrast, as shown in FIG. 9B, for the double-gate-structure TFT the threshold voltage varied by about −2.3 V over an elapsed time of about three hours. That is, the double-gate-structure TFT exhibits higher electrical stability than the single-gate-structure TFT. In other words, when the double-gate-structure TFT has current-voltage characteristics shown in FIG. 9B, this TFT may be consistently operated at a turn off voltage (Voff) of about −5 V. Thus, a reliability of the TFT may be enhanced by implementing the double gate structure of this embodiment of the invention.

As described above, according to the present invention, the TFT has a double gate structure in which a gate electrode is formed both above and below a semiconductor pattern, so that a variation of a threshold voltage in accordance with time is decreased.

Moreover, charge mobility is increased in comparison with a TFT having a single gate electrode, and an operating current may be increased at the same driving voltage.

Furthermore, a second gate electrode disposed on the semiconductor pattern is formed from the same conductive layer as a source electrode or a drain electrode, so that the second gate electrode is near the semiconductor pattern and electric characteristics of the semiconductor pattern may be more easily controlled. Moreover, even if a relatively thick organic insulation layer or a color filter layer is formed on the TFT, the distance between the second gate electrode and the semiconductor pattern is not affected. Thus, the organic insulation layer or the color filter later may secure electric stability of an array substrate with the double gate structure.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A thin-film transistor comprising:
a semiconductor pattern formed on a substrate;
a first conductive layer including a first gate electrode electrically insulated from the semiconductor pattern by a first gate insulation layer;
a second conductive layer including a source electrode electrically connected to the semiconductor pattern, a drain electrode spaced apart from the source electrode, and a second gate electrode electrically connected to the first gate electrode,
wherein the second gate electrode is electrically insulated from the semiconductor pattern by a second gate insulation layer, and electrically insulated from the source electrode and the drain electrode by a first upper insulation layer,
wherein the second conductive layer including the second gate electrode, the source electrode, and the drain electrode are formed of a same layer, and
wherein each of the source electrode and the drain electrode is formed directly on respective opposite edge portions of the second gate insulation layer and the semiconductor pattern, and directly on portions of the first gate insulation layer.

2. The thin-film transistor of claim 1, wherein the second gate electrode is disposed between the source electrode and the drain electrode, and is spaced apart from both the source electrode and the drain electrode.

3. The thin-film transistor of claim 1, further comprising:
a connection electrode connecting the first gate electrode and the second gate electrode.

4. The thin-film transistor of claim 3, wherein the connection electrode comprises an optically transparent and electrically conductive material.

5. The thin-film transistor of claim 3, wherein the second gate electrode directly contacts the first gate electrode.

6. The thin-film transistor of claim 5, wherein the first gate insulation layer is disposed between the first gate electrode and the semiconductor pattern, the first gate insulation layer having a contact hole formed therethough
where the second gate electrode contacts the first gate electrode.

7. The thin-film transistor of claim 1, wherein the second gate insulation layer is disposed between the semiconductor pattern and the second gate electrode to insulate the second gate electrode from the semiconductor pattern.

8. The thin-film transistor of claim 7, wherein the semiconductor pattern comprises an oxide semiconductor, the second gate insulation layer is an etch stopper covering at least a portion of the semiconductor pattern, and each of the source electrode and the drain electrode covers at least a portion of the semiconductor pattern and at least a portion of the etch stopper.

9. An array substrate comprising:
a first conductive pattern comprising a first gate electrode formed on a substrate;
a first gate insulation layer disposed on the first gate electrode;
a semiconductor pattern formed on the first gate insulation layer and electrically insulated from the first gate electrode by the first gate insulation layer;
a second gate insulation layer disposed on the semiconductor pattern;
a second conductive pattern comprising a source electrode electrically connected to the semiconductor pattern, a drain electrode spaced apart from the source electrode, and a second gate electrode electrically connected to the first gate electrode,
wherein the second gate electrode is electrically insulated from the semiconductor pattern by the second gate insulation layer, and electrically insulated from the source electrode and the drain electrode by a first upper insulation layer; and
a third conductive pattern comprising a pixel electrode electrically connected to the drain electrode,
wherein the second conductive layer including the second gate electrode, the source electrode, and the drain electrode are formed of a same layer, and
wherein each of the source electrode and the drain electrode is formed directly on respective opposite edge portions of the second gate insulation layer and the semiconductor pattern, and directly on portions of the first gate insulation layer.

10. The array substrate of claim 9, wherein the third conductive pattern further comprises a connection electrode which is insulated from the pixel electrode and is electrically connected to the first gate electrode and the second gate electrode.

11. The array substrate of claim 9, wherein the first gate insulation layer has a contact hole formed therethrough where the second gate electrode contacts the first gate electrode through the contact hole.

12. The array substrate of claim 9,
wherein the semiconductor pattern comprises an oxide semiconductor,
wherein the second gate insulation layer is an etch stopper covering at least a portion of the semiconductor pattern, and
wherein the source electrode and the drain electrode overlaps at least a portion of the semiconductor pattern and the etch stopper.

13. The array substrate of claim 9, wherein the first upper insulation layer covers the source electrode, the drain electrode, and the second gate electrode, and wherein a second upper insulation layer is formed on the first upper insulation layer,
and the pixel electrode is disposed on the second upper insulation layer.

14. The array substrate of claim 13, wherein the second upper insulation layer comprises at least one of an organic insulation layer and a color filter layer.

15. A method of manufacturing a thin-film transistor, the method comprising:
forming a first conductive layer on a substrate, wherein the first conductive layer comprises a first gate electrode;
forming a first gate insulation layer on the first gate electrode;
forming a semiconductor pattern on the first gate insulation layer;
forming a second gate insulation layer on the semiconductor pattern; and forming a second conductive layer on the second gate insulation layer, wherein the second conductive layer comprises a source electrode, a drain electrode, and a second gate electrode, wherein the second conductive layer including the second gate electrode, the source electrode, and the drain electrode are formed of a same layer, and wherein each of the source electrode and the drain electrode is formed directly on respective opposite edge portions of the second gate insulation layer and the semiconductor pattern, and directly on portions of the first gate insulation layer.

16. The method of claim 15, further comprising:

forming a contact hole exposing a portion of the first gate electrode and a portion of the second gate electrode; and forming a connection electrode from third conductive layer, wherein the connection electrode connects the first gate electrode and the second gate electrode through the contact hole.

17. The method of claim 15, wherein forming the second conductive layer further comprises:

patterning the first gate insulation layer to form a contact hole exposing a portion of the first gate electrode;

forming the second conductive layer on the substrate; and patterning the second conductive layer to form the second gate electrode contacting the first gate electrode through the contact hole.

18. The method of claim 17, wherein forming the first conductive layer further comprises:

forming a sacrifice layer on the first conductive layer;

forming a photoresist layer on the sacrifice layer;

patterning the photoresist layer to form a first photo pattern on a first area of the substrate and a second photo pattern on a second area of the substrate, wherein the second photo pattern has a thickness greater than that of the first photo pattern;

etching the first conductive layer and the sacrifice layer to form the first gate electrode and a sacrifice pattern on the first and second areas;

removing the first photo pattern to expose a portion of the sacrifice pattern in the first area, and removing a portion of the second photo pattern in the second area to form a remaining photo pattern on the second area; and removing the sacrifice pattern in the first area to form a remaining sacrifice pattern on the second area.

19. The method of claim 18, wherein forming the first gate insulation layer further comprises:

forming the first gate insulation layer on the first gate electrode and the remaining photo pattern; and removing the remaining sacrifice pattern, the remaining photo pattern, and a portion of the first gate insulation layer formed on the remaining photo pattern.

20. The method of claim 19, wherein removing the remaining sacrifice pattern further comprises:

etching the remaining sacrifice pattern to form an undercut beneath the remaining photo pattern, and applying an etching solution to the undercut, so as to remove the remaining sacrifice pattern and a portion of the first gate insulation layer formed on the remaining sacrifice pattern.

* * * * *